United States Patent
Kodani et al.

(10) Patent No.: US 7,582,551 B2
(45) Date of Patent: Sep. 1, 2009

(54) WIRING SUBSTRATE AND WIRING SUBSTRATE MANUFACTURING METHOD

(75) Inventors: Kotaro Kodani, Nagano (JP); Kentaro Kaneko, Nagano (JP); Kazuhiro Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/062,018

(22) Filed: Apr. 3, 2008

(65) Prior Publication Data

US 2008/0246146 A1 Oct. 9, 2008

(30) Foreign Application Priority Data

Apr. 4, 2007 (JP) .............................. 2007-098458

(51) Int. Cl.
*H01L 21/44* (2006.01)

(52) U.S. Cl. ........................ 438/597; 438/612; 438/616; 438/618

(58) Field of Classification Search .................. 438/597, 438/612, 616, 618

See application file for complete search history.

(56) References Cited

U.S. PATENT DOCUMENTS

2002/0173133 A1 * 11/2002 Towle et al. ................ 438/612

FOREIGN PATENT DOCUMENTS

| JP | 2003-229512 | 8/2003 |
|---|---|---|
| JP | 2004-064082 | 2/2004 |
| JP | 2005-005742 | 1/2005 |
| JP | 2005-244108 | 9/2005 |

* cited by examiner

*Primary Examiner*—Thanh V Pham
*Assistant Examiner*—Marvin Payen
(74) *Attorney, Agent, or Firm*—Rankin, Hill & Clark LLP

(57) ABSTRACT

A method of manufacturing a wiring substrate comprises: a first step of forming, on a support plate, an electrode pad made of metal; a second step of etching the support plate in such a manner that the support plate has a shape which includes a projection portion to be contacted with the electrode pad; a third step of forming, on the surface of the support plate, an insulating layer for covering the electrode pad; a fourth step of forming, on the surface of the insulating layer, a conductive pattern to be connected to the electrode pad; and, a fifth step of removing the support plate.

5 Claims, 10 Drawing Sheets

WIRING SUBSTRATE AND WIRING SUBSTRATE MANUFACTURING METHOD

This application claims priority to Japanese Patent Application No. 2007-098458, filed Apr. 4, 2007, in the Japanese Patent Office. The Japanese Patent Application No. 2007-098458 is incorporated by reference in its entirety.

TECHNICAL FIELD

The present disclosure relates to a wiring substrate which includes an electrode pad and a conductive pattern to be connected to the electrode pad.

RELATED ART

For example, as a wiring substrate (an electronic component) for mounting a mounting part such as a semiconductor chip thereon, there are proposed many wiring substrates which have various shapes and structures. Recently, with reduction in the thickness and size of the semiconductor chip, there has been increased the need for reduction in the thickness and size of the wiring substrate on which the semiconductor chip is to be mounted.

As a method for forming the wiring substrate in a thickness reduced manner, for example, there is known a so called build-up method. The build-up method is a method in which a build-up layer (build-up resin) made of epoxy-group resin material or the like is formed on a core substrate to form insulating layers between wirings to thereby manufacture a multi-layer wiring substrate.

The core substrate is made of a prepreg or the like. And, in a process for manufacturing a wiring substrate, the core substrate is used not only to support a soft build-up layer which is soft before it is hardened but also to prevent the warping of the build-up layer as it is hardened. However, in the build-up method, when reducing the thickness of the wiring substrate further, the thickness of the core substrate functioning as a base for the wiring substrate provides a problem.

In order to reduce the thickness of the wiring substrate further in the build-up method, there is proposed a method in which, after the wiring substrate is formed on the support plate for supporting the wiring substrate (a build-up layer) according to the build-up method, the support plate is removed (for example, see Japanese Patent Application Publication No. 2005-5742 (patent reference 1)).

Now, FIG. 1 shows a portion of the structure of a wiring substrate which is formed using a support plate. Referring to FIG. 1, there is formed an electrode pad 1 in such a manner that it faces a support plate (not shown) to be removed by etching or the like, and there is formed an insulating layer 2 made of resin material or the like in such a manner as to cover the periphery of the electrode pad 1. Also, to the electrode pad 1, there is connected a conductive pattern 3 which is made of a via plug or the like. The electrode pad 1 includes, for example, an Au layer A1 and a Ni layer B1.

In the above-mentioned structure, the surface of the insulating layer 2 and the surface of the electrode pad 1 are formed substantially flush with each other. Therefore, in a boundary surface (in FIG. 1, it is shown by the A portion) between the side surface of the electrode pad 1 and insulating layer 2, there is caused a separation phenomenon called de-lamination, resulting in the lowered reliability of an electronic component.

As a countermeasure against the above-mentioned de-lamination, for example, there is proposed a structure in which the shape of the electrode pad is changed to thereby include such a wall portion therein that extends on the opposite side of the exposure surface of the electrode pad (for example, see Japanese Patent Application Publication No. 2005-244108 (patent reference 2)).

However, as disclosed in the above-cited patent reference 2, when the shape of the electrode pad is formed complicated, there is increased the number of steps of forming the electrode pad, thereby raising a fear that the manufacturing cost of the wiring substrate can increase. This method is not practical.

Also, although there is proposed a structure for installing the electrode pad in such a manner that it is recessed with respect to the insulating layer (for example, see Japanese Patent Application Publication No. 2004-640 82 (patent reference 3) and Japanese Patent Application Publication No. 2003-229512 (patent reference 4), there cannot be expected a sufficient effect on the separation of the boundary surface between the electrode pad and insulating layer; that is, this method is not be able to prevent the reduced reliability of the wiring substrate effectively.

SUMMARY

Exemplary embodiments of the present invention provide a new and useful wiring substrate.

Exemplary embodiments of the present invention provide a wiring substrate which can prevent separation between an electrode pad and an insulating layer and is thus highly reliable.

According to a first aspect of the invention, there is provided a wiring substrate manufacturing method which comprises: a first step of forming, on a support plate, an electrode pad made of metal; a second step of etching the support plate in such a manner that the support plate has a shape including a projection portion to be contacted with the electrode pad; a third step of forming, on the surface of the support plate, an insulating layer for covering the electrode pad; a fourth step of forming, on the surface of the insulating layer, a conductive pattern to be connected to the electrode pad; and, a fifth step of removing the support plate.

Also, according to a second aspect of the invention, in order to solve the above problems, there is provided a wiring substrate which comprises: an electrode pad; a conductive pattern to be connected to the electrode pad; and, an insulating layer in which the electrode pad is to be embedded, the insulating layer having an opening to which a portion of the main surface of the electrode pad is exposed, wherein the end portion of the main surface is covered with the insulating layer.

According to the invention, it is possible to provide a wiring substrate which can prevent separation between the electrode pad and insulating layer and is thus highly reliable.

Other features and advantages may be apparent from the following detailed description, the accompanying drawings and the claims.

DETAILED DESCRIPTION

Figure 1:
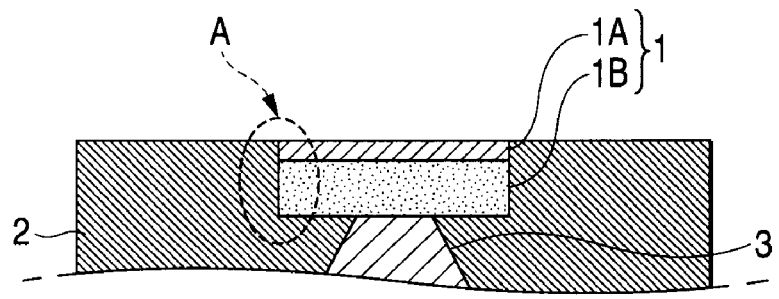
FIG. 1 is a typical view of the structure of a related-art electronic component.
Figure 2:
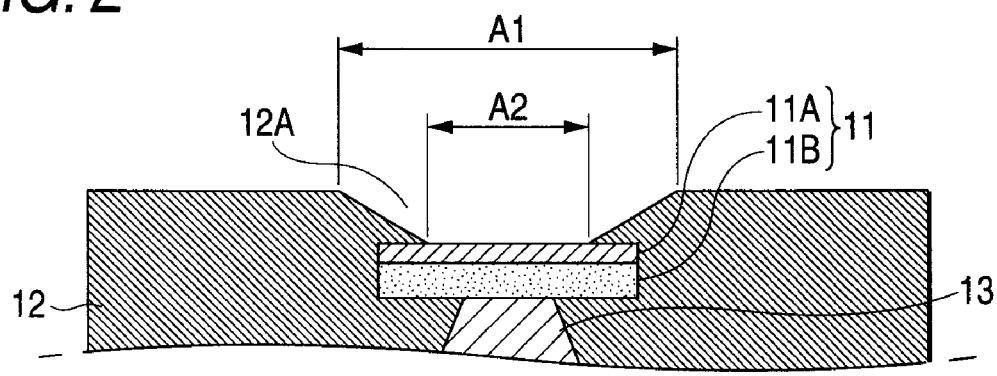
FIG. 2 is a typical view of the structure of an electronic component according to the invention.

Now, FIG. 2 shows a portion of the structure of a wiring substrate which is formed using a support plate according to the invention. Referring to FIG. 2, there is formed an electrode pad 11 in such a manner that it faces a support plate (not shown) to be removed by etching or the like, and there is formed an insulating layer 12 made of resin material or the like in such a manner as to cover the periphery of the electrode pad 11. Also, to the electrode pad 11, there is connected a conductive pattern 13 which is made of a via plug or the like. The electrode pad 11 includes, for example, an Au layer 11A and a Ni layer 11B. Also, there may also be interposed a Pd layer between the Au layer 11A and Ni layer 11B.

According to an aspect of the above structure, the electrode pad 11 is embedded in the insulating layer 12, the insulating layer 12 includes an opening 12A to which a portion of the main surface (the outer surface of the Au layer 11A) of the electrode pad 11 is exposed, and, the end portion (the peripheral portion) of the electrode pad 11 is covered with the insulating layer 12.

The present structure can prevent the insulating layer 12 from being separated from the electrode pad 11, thereby providing the excellent reliability of the structure of an electronic component. In the related art, there is found a case where separation called de-lamination occurs between the side wall of the electrode pad and insulating layer. However, in the present structure, an insulating film, in which the electrode pad is embedded, extends also upwardly of the electrode pad and covers the end portion of the main surface (exposed surface) of the electrode pad, thereby being able to effectively prevent the occurrence of such de-lamination.

Also, in the related art, for example, there is employed a structure in which, on the insulating layer, there is formed a solder resist layer to cover the peripheral edge portion of the electrode pad. However, the invention is different from such related art structure in that the insulating layer is formed so as to allow the embedment of the electrode pad therein and the end portion of the exposed surface of the electrode pad is covered with the insulating layer. That is, in the structure according to the invention, the insulating layer for embedment of the electrode pad and the insulating layer for covering the end portion of the exposed surface of the electrode pad are formed as an integral body, thereby increasing the preventive effect on the occurrence of the de-lamination.

Specifically, the opening 12A has a tapered shape which increases in dimension from the side thereof in contact with the electrode pad 11 toward the side thereof parting away from the electrode pad 11. That is, the opening 12A is formed in such a manner that the upper surface side opening diameter A1 thereof is larger than the electrode pad contact side opening diameter A2 thereof. Such the opening 12A with the tapered shape has the following advantageous. In a case where a solder ball is provided on the electrode pad as shown in FIG. 5I, the solder ball is easy to be mounted on the opening, when compared with the opening which does not have a tapered shape where the upper surface side opening diameter is the same as the electrode pad contact side opening diameter, especially in a case where the diameter of the solder ball is larger than the electrode pad contact side opening diameter of the opening.

The above structure can be realized in the following manner: for example, after the electrode pad 11 is formed on the support plate, the support plate is etched to thereby allow the support plate to have a projection portion for being in contact with the electrode pad 11, and, after then, the insulating layer 12 is formed. From now on, description will be given below of the summary of a method for manufacturing a wiring substrate (an electronic component) by etching a support plate.

FIGS. 3A to 3D respectively show the summary of the method for manufacturing the wiring substrate by etching the support plate. Here, the parts previously described are given the same designations and thus, in some cases, the description thereof will be omitted (which applies similarly to the following description as well).

Figure 3A:
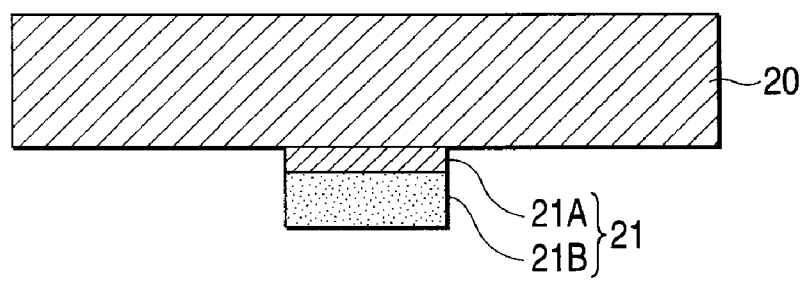
FIG. 3A is a view of (a step 1) of a first example of an electronic component manufacturing method according to the invention.

Firstly, in a step shown in FIG. 3A, on a support plate 20 made of Cu or the like, there is formed an electrode pad 21 having a layer structure composed of an Au layer 21A and a Ni layer 21B (the Au layer 21A is disposed on the support plate 20 side) according to an electrolytic plating method using the support plate 20 as a power supply passage.

Figure 3B:
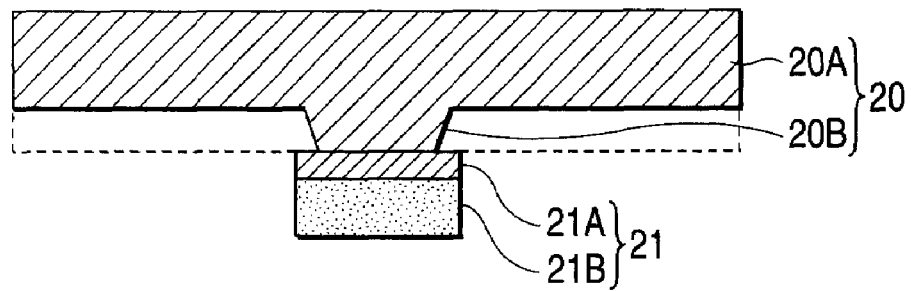
FIG. 3B is a view of (a step 2) of the first example of an electronic component manufacturing method according to the invention.

Next, in a step shown in FIG. 3B, of the electrode pad 21 and support plate 20, the support plate 20 is selectively etched from the side thereof with the electrode pad 21 formed according to a wet etching method using an alkaline-group drug solution or the like. As a result of this, the support plate 20 has a shape which includes a projection portion 20B in contact with the electrode pad 21 and a flat-plate-shaped support plate main body 20A. Owing to the above etching processing, there is decreased the contact area between the support plate 20 and electrode pad 21. In other words, the tip end, which is in contact with the electrode pad 21, of the projection portion 20B is smaller than the main surface of the electrode pad 21. Also, the projection portion 20B is formed in such a tapered shape that the section area thereof increases from the side thereof to be contacted with the electrode pad 21 toward the side thereof to be connected to the support plate main body 20A.

Figure 3C:
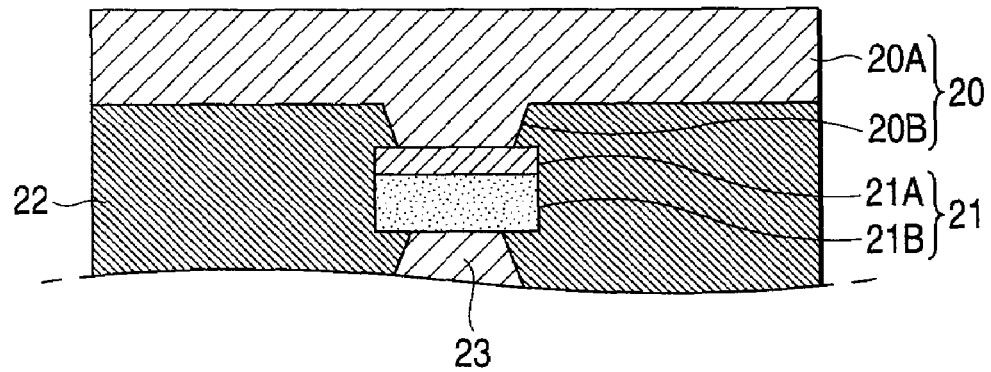
FIG. 3C is a view of (a step 3) of the first example of an electronic component manufacturing method according to the invention.

Next, in a step shown in FIG. 3C, on the support plate 20, there is formed an insulating layer 22 which is made of resin material or the like and is used to cover the electrode pad 21. Further, there is formed a conductive pattern 23 which is made of a via plug or the like and is to be connected to the electrode pad 21. After then, as the need arises, there may also be formed another insulating layer and there may further be formed a conductive pattern to thereby form a multi-layer wiring structure (the formation of such multi-layer wiring structure will be discussed later).

Figure 3D:
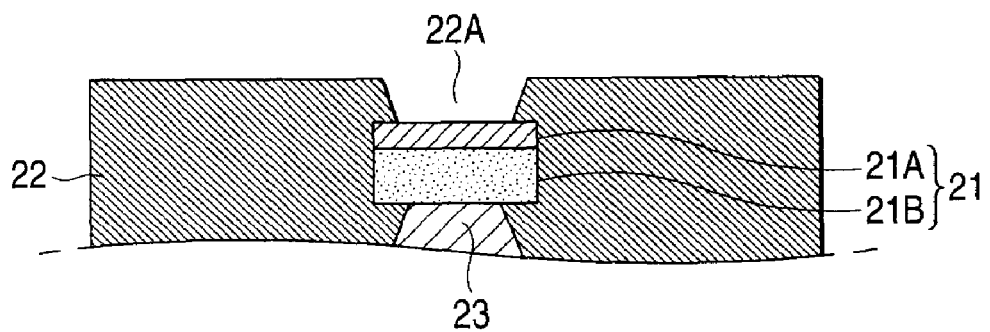
FIG. 3D is a view of (a step 4) of the first example of an electronic component manufacturing method according to the invention.

Next, in a step shown in FIG. 3D, the support plate 20 is removed according to a wet etching processing to thereby manufacture a wiring substrate (an electronic component) which includes a tapered opening 22A.

Also, when, between the support plate and electrode pad, there is formed a height adjust pad made of substantially the same material as the support plate, the depth of the opening to be formed in the insulating layer can be increased. In this case, the height adjust pad is removed together with the support plate. Now, description will be given below of the summary of a method for manufacturing an electronic component using the height adjust pad.

Figure 4A:
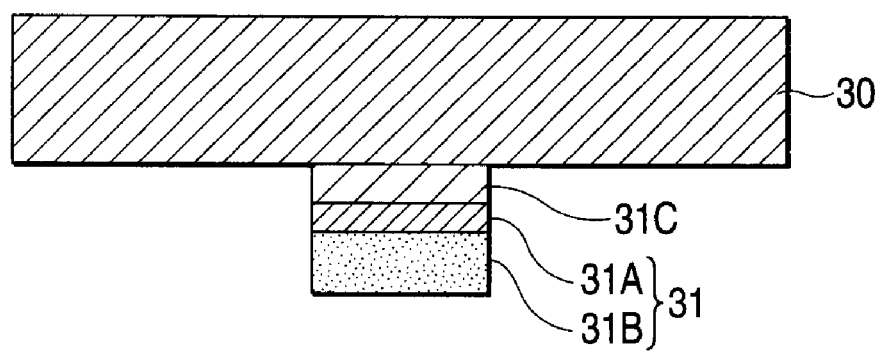
FIG. 4A is a view of (a step 1) of a second example of an electronic component manufacturing method according to the invention.

Firstly, in a step shown in FIG. 4A, on a support plate 30 made of Cu or the like, there is formed a height adjust pad 31C made of substantially the same material (Cu) as the support plate 30 according to an electrolytic plating method using the support plate 30 as a power supply passage. Further, on the height adjust pad 31C, there is formed an electrode pad 31 having a layer structure composed of an Au layer 31A and a Ni layer 31B (in which the Au layer 31A is disposed on the height adjust pad 31C side) according to an electrolytic plating method using the height adjust pad 31C as a power supply passage.

Figure 4B:
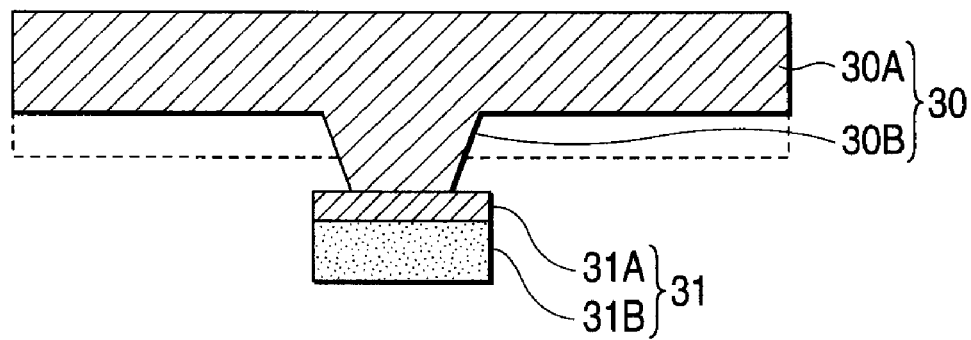
FIG. 4B is a view of (a step 2) of the second example of an electronic component manufacturing method according to the invention.

Next, in a step shown in FIG. 4B, the support plate 30 and height adjust pad 31C are etched according to a wet etching processing using an alkaline-group drug solution or the like. As a result of this, the support plate 30 is turned into a shape which includes a projection portion 30B to be contacted with the electrode pad 31 and a flat-plate-shaped support plate main body 30A. In this case, the projection portion 30B is structured such that it includes the height adjust pad 31C.

And, the above etching processing reduces the contact area between the height adjust pad 31C and electrode pad 31. In other words, the tip end, which is in contact with the electrode pad 31, of the projection portion 30B (the height adjust pad 31C) is smaller than the main surface of the electrode pad 31. Also, the projection portion 30B is formed in such a tapered manner that the section area thereof increases from the side thereof to be contacted with the electrode pad 31 toward the side thereof to be connected to the support plate main body 30A.

Figure 4C:
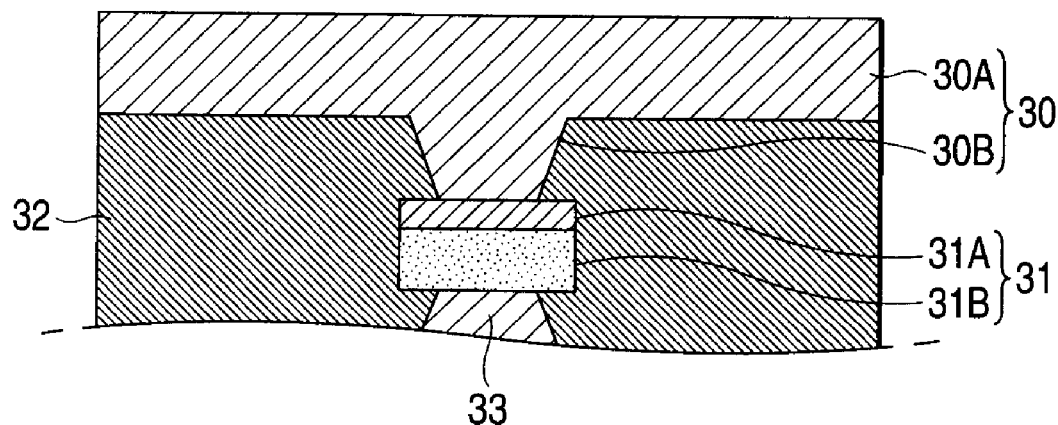
FIG. 4C is a view of (a step 3) of the second example of an electronic component manufacturing method according to the invention.

Next, in a step shown in FIG. 4C, on the support plate 30, there is formed an insulating layer 32 which is made of resin material or the like and is used to cover the electrode pad 31. Further, there is formed a conductive pattern 33 which is made of a via plug or the like and is to be connected to the electrode pad 31. After then, as the need arises, there may also be formed another insulating layer and there may further be formed a conductive pattern to thereby form a multi-layer wiring structure (the formation of such multi-layer wiring structure will be discussed later).

Figure 4D:
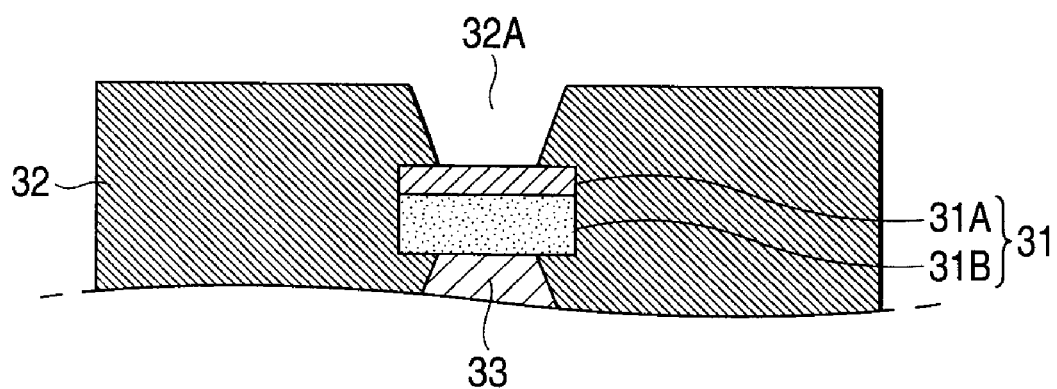
FIG. 4D is a view of (a step 4) of the second example of an electronic component manufacturing method according to the invention.

Next, in a step shown in FIG. 4D, the support plate 30 and height adjust pad 31C are removed according to a wet etching processing using a drug solution, whereby there can be manufactured a wiring substrate (an electronic component) having a tapered opening 32A.

According to the above method, it is possible to increase the depth of the opening 32A which is formed in the insulating layer 32. Also, this method can provide an effect that the etching time necessary in the step shown in FIG. 4B can be reduced when compared with the step shown in FIG. 3B of forming the projection portion 20B whose height is the same as that of the projection portion 30B.

Next, a more specific example of the method shown in the above-mentioned FIGS. 3A to 3D is shown as an embodiment 1, while a more specific example of the method shown in the above-mentioned FIGS. 4A to 4D is shown as an embodiment 2; and, description will be given below of these embodiments 1 and 2 with reference to FIGS. 5 and 6.

Embodiment 1

FIGS. 5A to 5J respectively show the procedures or steps of a wiring substrate (an electronic component) manufacturing method according to the embodiment 1.

Figure 5A:
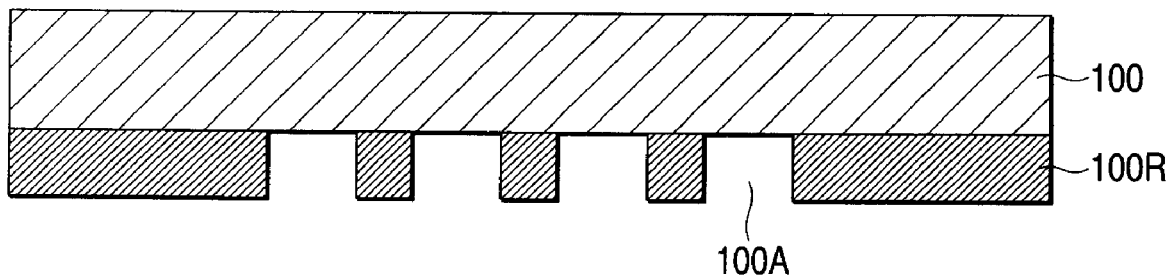
FIG. 5A is a view of (a step 1) of an embodiment 1 of an electronic component manufacturing method according to the invention.

Firstly, in a step shown in FIG. 5A, on a support plate 100 made of metal material such as Cu, there is formed a mask pattern 100R having an opening 100A according to a photolithography method using a resist.

Figure 5B:
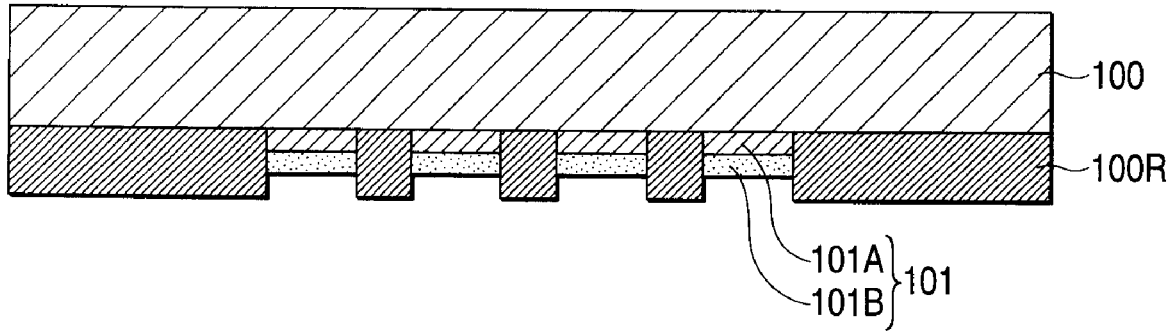
FIG. 5B is a view of (a step 2) of the embodiment 1 of an electronic component manufacturing method according to the invention.

Next, in a step shown in FIG. 5B, on the surface of the support plate 100 that is exposed from the opening 100A, for example, there is formed an electrode pad 101 having a layer structure including an Au layer 101A and a Ni layer 101B (the Au layer 101A is disposed on the support plate 100 side) according to an electrolytic plating method using the support plate 100 as a power supply passage.

Also, the electrode pad 101 has the layer structure that includes, for example, the Au layer and Ni layer. However, this is not limitative but the electrode pad 101 may also have other various layer structures, for example, a layer structure including an Au layer, a Ni layer and a Cu layer (the Au layer is disposed on the support plate 100 side); and, a layer structure including a Au layer and a Cu layer (the Au layer is disposed on the support plate 100 side). Further, there may also be employed a three layer structure in which a Pd layer is interposed between an Au layer and a Ni layer).

Figure 5C:
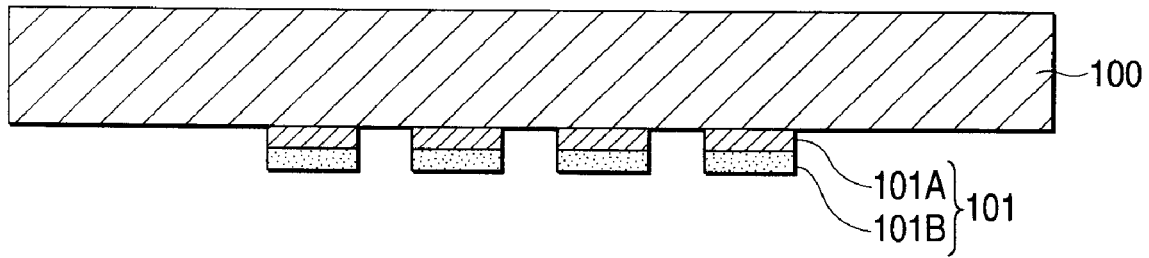
FIG. 5C is a view of (a step 3) of the embodiment 1 of an electronic component manufacturing method according to the invention.

Next, in a step shown in FIG. 5C, there is removed the mask pattern 100R on the support plate 100.

Figure 5D:
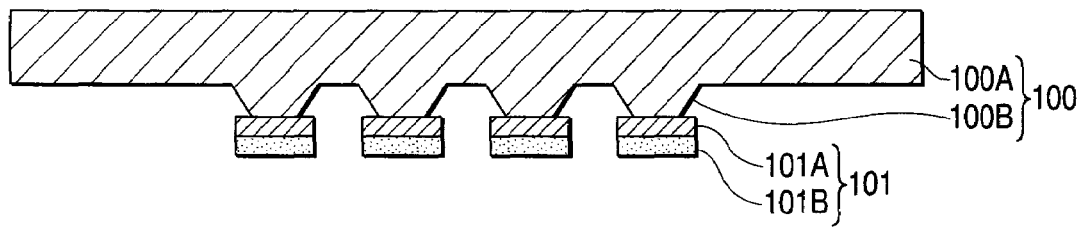
FIG. 5D is a view of (a step 4) of the embodiment 1 of an electronic component manufacturing method according to the invention.

Next, in a step shown in FIG. 5D, of the electrode pad 101 and support plate 100, the support plate 100 is selectively etched according to a wet etching processing using an alkaline-group drug solution or the like. As a result of this, the support plate 100 is turned into a shape which includes a projection portion 100B to be contacted with the electrode pad 101 and a flat-plate-shaped support plate main body 100A. Also, the above etching processing reduces the contact area between the support plate 100 and electrode pad 101. Also, the projection portion 100B is formed in such a tapered manner that the section area thereof increases from the side thereof to be contacted with the electrode pad 101 toward the side thereof to be connected to the support plate main body 100A.

In the above structure, as the metal that the electrode pad 101 is made of, there may be selected such metal that can increase the selection ratio in the wet etching processing. Also, as the drug solution, there may be selected such drug solution that can increase the selection ratio in the wet etching processing. Further, there may also be provided, on the electrode pad 101, a metal layer (a metal mask) made of metal material such as an Sn layer which is different from the metal material of the electrode pad 101.

Figure 5E:
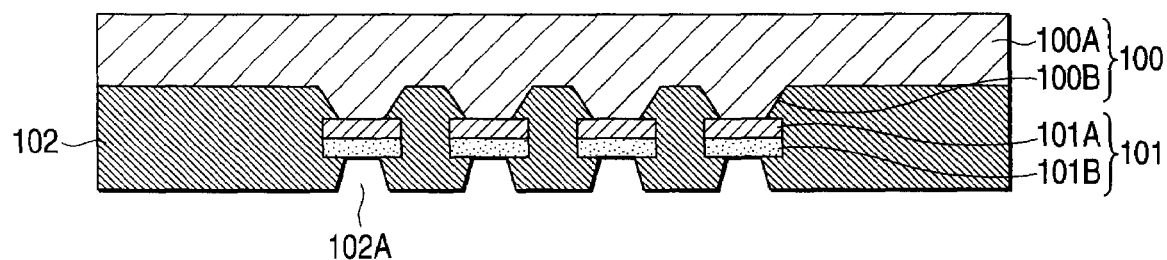
FIG. 5E is a view of (a step 5) of the embodiment 1 of an electronic component manufacturing method according to the invention.

Next, in a step shown in FIG. 5E, on the support plate 100, there is formed an insulating layer (a build-up layer) 102 which is made mainly of resin material such as epoxy-group resin and is used to cover the electrode pad 101. Further, on the insulating layer 102, using a laser or the like, there is formed a via hole 102A which reaches the electrode pad 101. In this case, the peripheral edge portion of the electrode pad 101 is formed such that it is not exposed but is covered with the insulating layer 102.

Figure 5F:
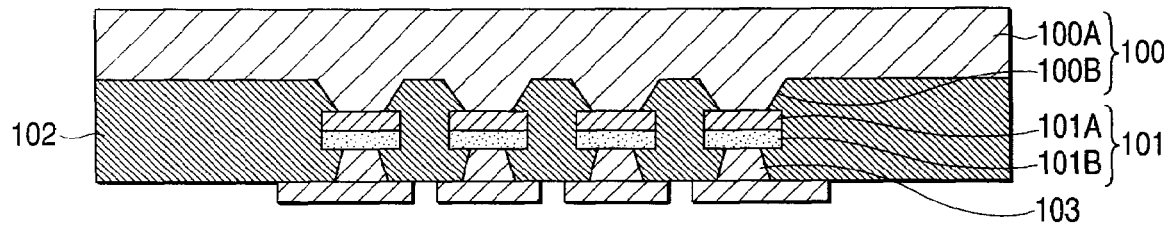
FIG. 5F is a view of (a step 6) of the embodiment 1 of an electronic component manufacturing method according to the invention.

Next, in a step shown in FIG. 5F, firstly, according to a nonelectrolytic Cu plating method, there is formed a seed layer (not shown) on the surface of the insulating layer 102 and, after then, on the seed layer, there is formed a resist pattern (not shown). Further, according to an electrolytic Cu plating method using the seed layer as a power supply passage, there is formed a conductive pattern 103 which includes a via plug to be formed into the via hole 102A and a pattern wiring to be connected to the via plug. After formation of the conductive pattern 103, the resist pattern is separated; and, the seed layer, which is exposed due to the separation of the resist pattern, is removed according to an etching processing.

Figure 5G:
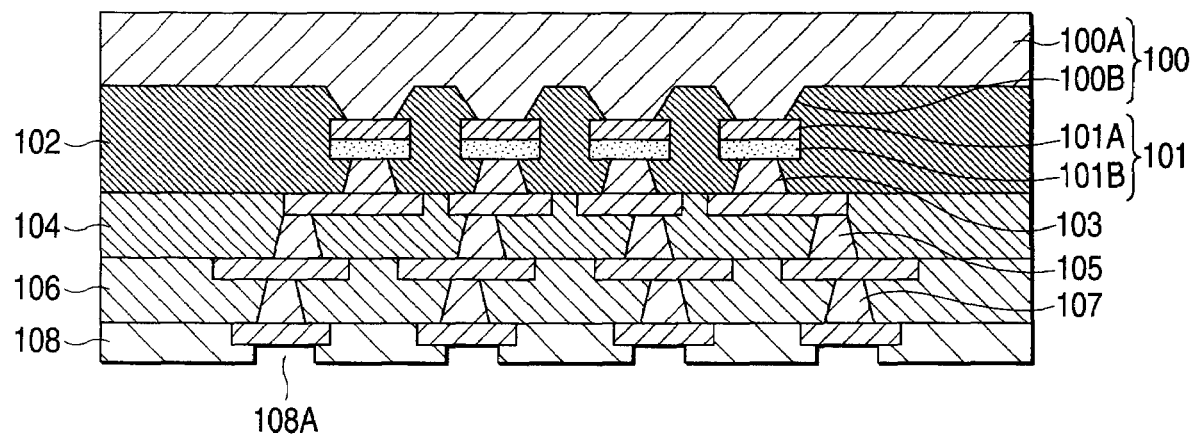
FIG. 5G is a view of (a step 7) of the embodiment 1 of an electronic component manufacturing method according to the invention.

Next, in a step shown in FIG. 5G, there are repeated the steps shown in FIGS. 5E and 5F, whereby, on the insulating layer 102, there are formed sequentially insulating layers 104 and 106 respectively corresponding to the insulating layer 102 to thereby form conductive patterns 105 and 107 respectively corresponding to the conductive patterns 103.

Further, on the insulating layer 106, there is formed an insulating layer 108 made of a solder resist and including an opening 108A to which a portion of the conductive pattern 107 is exposed.

Figure 5H:
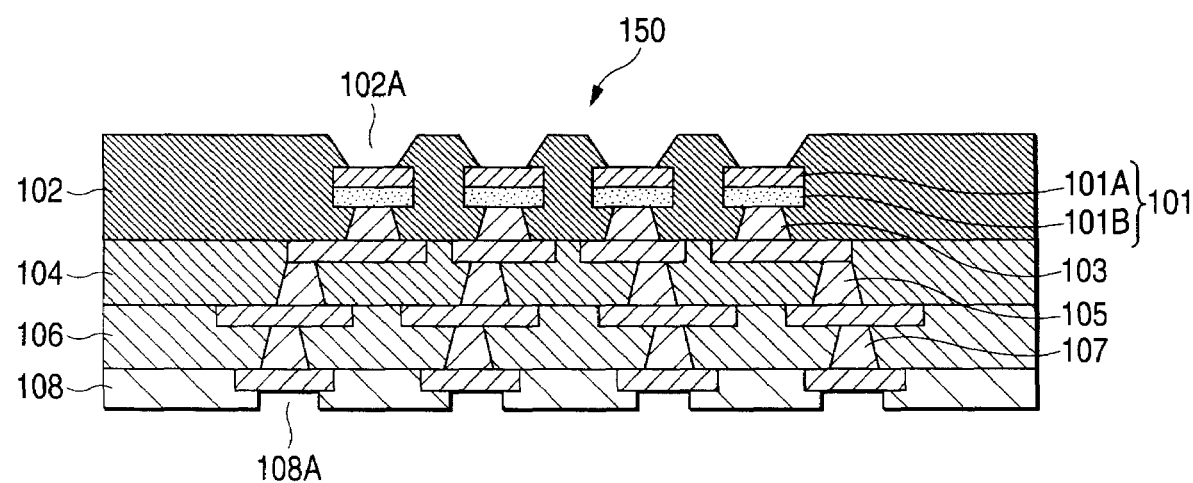
FIG. 5H is a view of (a step 8) of the embodiment 1 of an electronic component manufacturing method according to the invention.
Figure 5I:
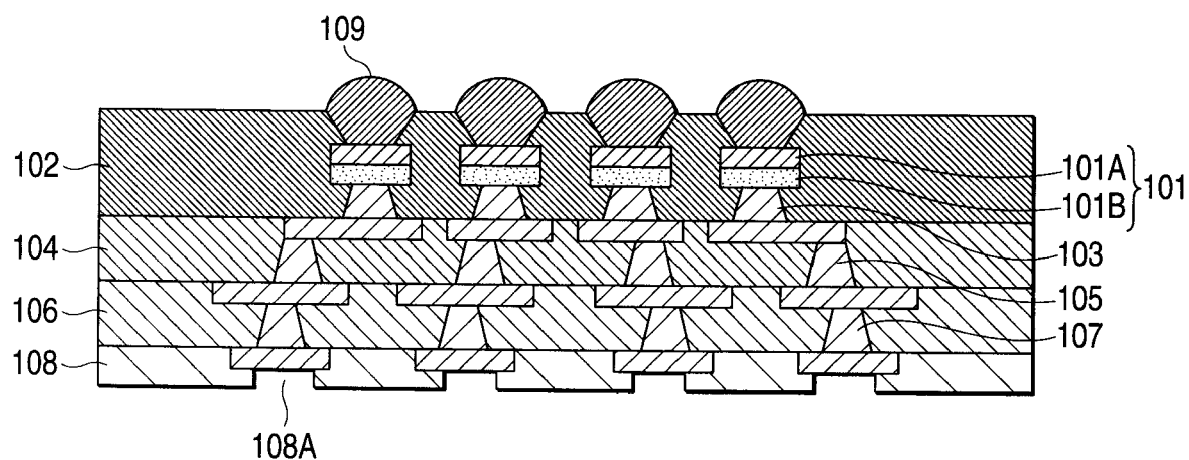
FIG. 5I is a view of (a step 9) of the embodiment 1 of an electronic component manufacturing method according to the invention.

Next, in a step shown in FIG. 5H, the support plate 100 made of Cu is removed according to a wet etching processing using a drug solution or the like. In this manner, there can be formed a multi-layer wiring substrate (an electronic component) 150.

In the above-mentioned electronic component 150, there may also be formed the following connecting portions, and a mounting part such as a semiconductor chip may also be mounted onto the electronic component 150 through the connecting portions.

For example, as shown in FIG. 5I, according to a printing method or according to a processing in which a solder ball is swung in and the solder of the solder ball is re-flowed, on the electrode pad 101, there are formed connecting portions (solder bumps) 109 which are respectively made of solder.

Figure 5J:
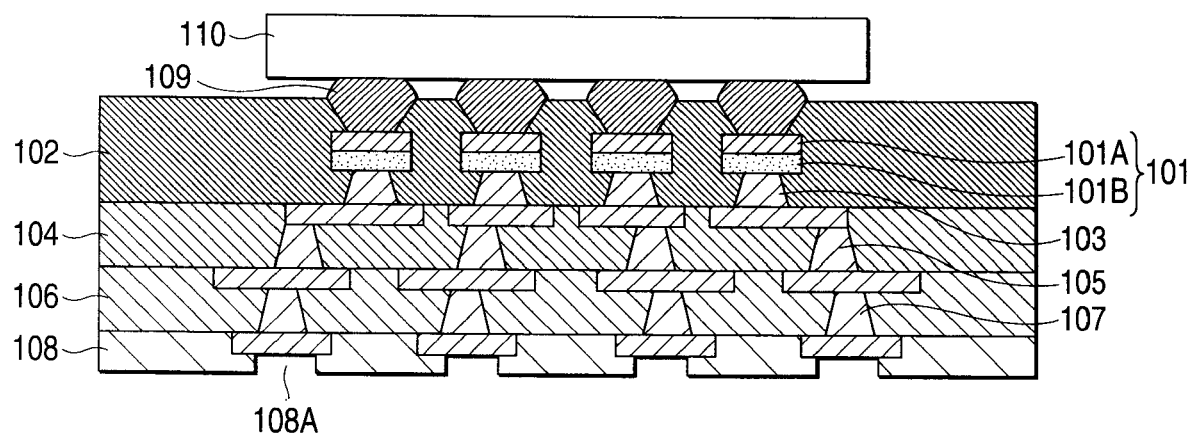
FIG. 5J is a view of (a step 10) of the embodiment 1 of an electronic component manufacturing method according to the invention.

In a step shown in FIG. 5J, there may also be mounted a mounting part 110 made of a semiconductor chip or the like in such a manner that it is connected to the connecting portions 109.

Further, in the above-mentioned electronic component 150, the electrode pad 101 is used for mounting the mounting part such as a semiconductor chip; however, the electrode pad 101 may be used as an external connection terminal.

The mounting part 110 may also be mounted in such a manner that it is connected to the conductive patterns 107 respectively exposed from the openings 108A of the insulating layer 108.

Embodiment 2

Also, FIGS. 6A to 6D respectively show the procedures or steps of a multi-layer wiring substrate (an electronic component) manufacturing method according to an embodiment 2 of the invention.

Figure 6A:
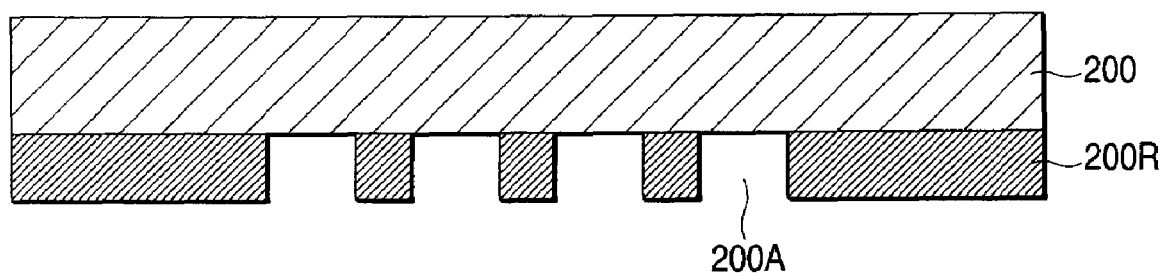
FIG. 6A is a view of (a step 1) of an embodiment 2 of an electronic component manufacturing method according to the invention.

Firstly, in a step shown in FIG. 6A, on a support plate 200 made of metal material such as Cu, according to a photolithography method using a resist, there is formed a mask pattern 200R which has an opening 200A.

Figure 6B:
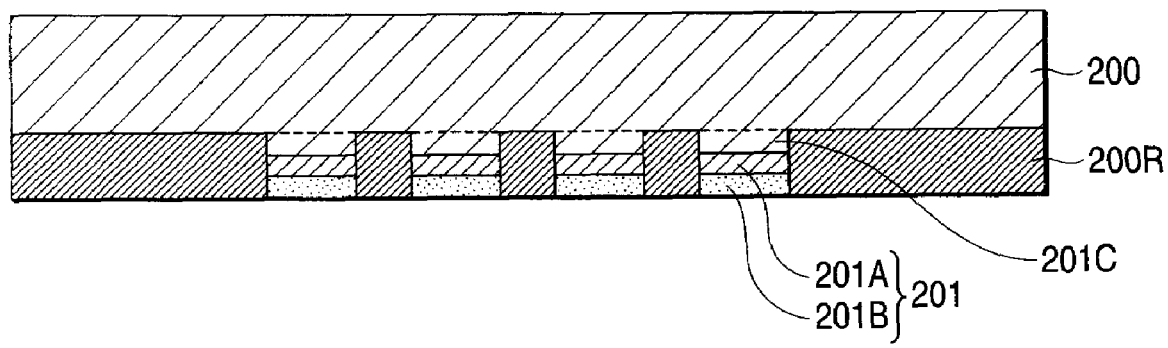
FIG. 6B is a view of (a step 2) of the embodiment 2 of an electronic component manufacturing method according to the invention.

Next, in a step shown in FIG. 6B, firstly, on the surface of a support plate 200 which is exposed from the opening 200A, there is formed a height adjust pad 201C made of substantially the same material (Cu) as the support plate 200 according to an electrolytic plating method using the support plate 200 as a power supply passage. Next, on the height adjust pad 201C, there is formed an electrode pad 201 having a layer structure including an Au layer 201A and a Ni layer 201B (the Au layer 201A is disposed on the height adjust pad 201C side) according to an electrolytic plating method using the height adjust pad 201C as a power supply passage.

Figure 6C:
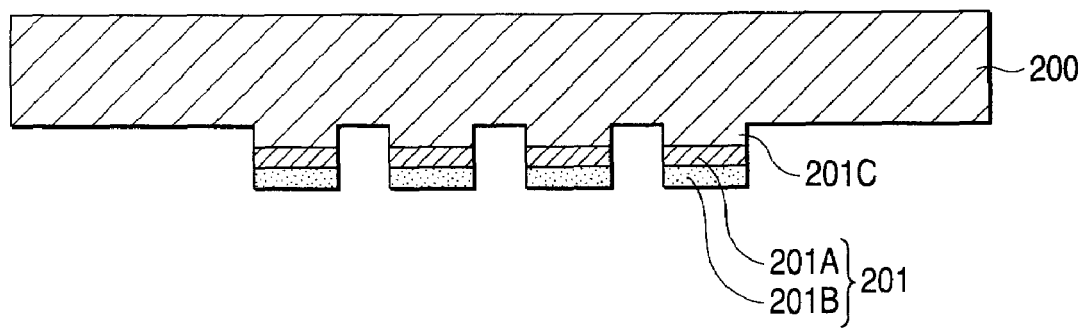
FIG. 6C is a view of (a step 3) of the embodiment 2 of an electronic component manufacturing method according to the invention.

Next, in a step shown in FIG. 6C, the mask pattern 200R on the support plate 200 is removed.

Figure 6D:
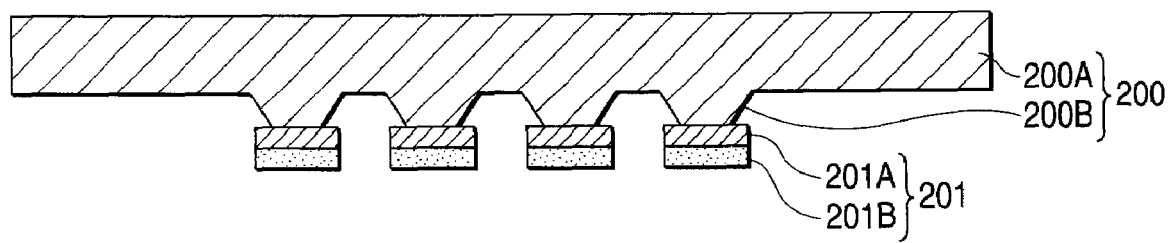
FIG. 6D is a view of (a step 4) of the embodiment 2 of an electronic component manufacturing method according to the invention.

Next, in a step shown in FIG. 6D, of the electrode pad 201, height adjust pad 201C and support plate 200, the support plate 200 and height adjust pad 201C are selectively etched according to a wet etching processing using an alkaline-group drug solution or the like. As a result of this, the support plate 200 is turned into a shape which includes a projection portion 200B to be contacted with the electrode pad 201 and a flat-plate-shaped support plate main body 200A. In this case, the projection portion 200B is structured such that it substantially includes the height adjust pad 201C. Also, the above etching processing reduces the contact area between the projection portion 200B and electrode pad 201. And, the projection portion 200B is formed in such a tapered shape that the section area thereof increases from the side thereof to be contacted with the electrode pad 201 toward the side thereof to be connected to the support plate main body 200A.

After then, by performing steps similar to the steps shown in FIG. 5E and its following figures according to the embodiment 1, there are formed the elements shown in the embodiment 1, that is, the insulating layers 102, 104, 106, 108, conductive patterns 103, 105, 107 and further, as the need arises, there are formed the connecting portions 109, and the mounting part is mounted through these connecting portions 109, thereby being able to manufacture a multi-player wire substrate (an electronic component).

Although description has been given heretofore of the preferred examples and embodiments according to the invention, the invention is not limited to the above-mentioned specific examples and embodiments but various modifications and changes are also possible without departing from the subject matter of the invention as set forth in the scopes of the appended patent claims.

According to the invention, it is possible to provide a wiring substrate which not only can prevent separation of an electrode pad and an insulating layer from each other but also can provide high reliability.

What is claimed is:

1. A wiring substrate manufacturing method, comprising:
   a first step of forming, on a support plate, an electrode pad made of metal;
   a second step of etching the support plate in such a manner that the support plate has a shape including a projection portion to be contacted with the electrode pad and a tip end, which is in contact with the electrode pad, of the projection portion is smaller than a surface of the electrode pad at a side to be contacted with the projection portion;
   a third step of forming, on a surface of the support plate, an insulating layer for covering the electrode pad;
   a fourth step of forming, on a surface of the insulating layer, a conductive pattern to be connected to the electrode pad; and
   a fifth step of removing the support plate,
   wherein the electrode pad and support plate are made of different metal material and, in the second step, of the electrode pad and support plate, the support plate is selectively etched.

2. A wiring substrate manufacturing method as set forth in claim 1, further comprising:
   a step of forming, between the support plate and electrode pad, a height adjust pad made of substantially the same material as the support plate.

3. A wiring substrate manufacturing method as set forth in claim 2, wherein, in the fifth step, the height adjust pad is removed together with the support plate by wet etching.

4. A wiring substrate manufacturing method as set forth in claim 1, wherein, in the second step, the support plate is etched in such a manner that the projection portion has a tapered shape.

5. A wiring substrate manufacturing method as set forth in claim 1, wherein the fourth step includes:
   a step of forming a via hole which reaches the electrode pad in the insulating layer; and
   a step of forming a via plug in the via hole and a pattern wiring to be connected to the via plug to form the conductive pattern.

* * * * *